(12) United States Patent
Nelson et al.

(10) Patent No.: US 9,540,277 B2
(45) Date of Patent: Jan. 10, 2017

(54) APPARATUS FOR DEPOSITING THIN FILM COATINGS AND METHOD OF DEPOSITION UTILIZING SUCH APPARATUS

(75) Inventors: Douglas M. Nelson, Curtice, OH (US); Ian R. Williams, West Lancashire (GB); Michel J. Soubeyrand, Holland, OH (US); David A. Strickler, Toledo, OH (US); Kevin D. Sanderson, Wigan (GB); Yasunori Seto, Osaka (JP); Keiko Tsuri, Osaka (JP)

(73) Assignee: Pilkington Group Limited, St. Helens (GB)

( * ) Notice: Subject to any disclaimer, the term of this patent is extended or adjusted under 35 U.S.C. 154(b) by 352 days.

(21) Appl. No.: 13/426,697

(22) Filed: Mar. 22, 2012

(65) Prior Publication Data

US 2012/0240627 A1    Sep. 27, 2012

Related U.S. Application Data

(60) Provisional application No. 61/466,501, filed on Mar. 23, 2011.

(51) Int. Cl.
| | | |
|---|---|---|
| *C23C 16/455* | (2006.01) | |
| *C23C 16/54* | (2006.01) | |
| *C03C 17/00* | (2006.01) | |
| *C03C 17/245* | (2006.01) | |
| *C23C 16/458* | (2006.01) | |

(52) U.S. Cl.
CPC ............ *C03C 17/002* (2013.01); *C03C 17/245* (2013.01); *C23C 16/458* (2013.01); *C23C 16/45514* (2013.01); *C23C 16/45574* (2013.01); *C23C 16/45578* (2013.01); *C23C 16/545* (2013.01); *C03C 2218/152* (2013.01)

(58) Field of Classification Search
CPC .................. C23C 16/45578; C23C 16/45595; C23C 16/45574; C23C 16/545; C23C 16/45514; C23C 16/458; C03C 17/245; C03C 17/002
See application file for complete search history.

(56) References Cited

U.S. PATENT DOCUMENTS

| | | | |
|---|---|---|---|
| 4,294,868 A | 10/1981 | Kalbskopf | |
| 4,351,267 A * | 9/1982 | Kalbskopf et al. | ........... 118/718 |
| 4,361,284 A | 11/1982 | Kalbskopf | |
| 4,446,815 A * | 5/1984 | Kalbskopf et al. | ........... 118/718 |
| 4,834,020 A | 5/1989 | Bartholomew et al. | |
| 5,041,150 A | 8/1991 | Grundy et al. | |

(Continued)

FOREIGN PATENT DOCUMENTS

| | | |
|---|---|---|
| EP | 0611733 A2 | 8/1994 |
| EP | 2733125 | 5/2014 |

(Continued)

*Primary Examiner* — Gordon R Baldwin
*Assistant Examiner* — Aiden Lee
(74) *Attorney, Agent, or Firm* — Marshall & Melhorn, LLC (57) ABSTRACT

The invention relates to an apparatus for depositing thin film coatings on a substrate. The deposition apparatus is designed to keep gaseous reactant materials to be deposited apart from one another in the deposition apparatus, by one or more separation devices and/or methods, but nevertheless, to allow the chemical reactants to mix and react at or near the substrate surface, rapidly enough to create a uniform film at commercially viable deposition rates.

15 Claims, 9 Drawing Sheets

(56) References Cited

U.S. PATENT DOCUMENTS

| | | | |
|---|---|---|---|
| 5,122,391 A | | 6/1992 | Mayer |
| 5,136,975 A | | 8/1992 | Bartholomew et al. |
| 5,356,718 A | | 10/1994 | Athey et al. |
| 5,464,657 A | | 11/1995 | Athey et al. |
| 5,683,516 A | | 11/1997 | DeDontney et al. |
| 5,704,982 A | | 1/1998 | Oudard et al. |
| 5,798,142 A | * | 8/1998 | Soubeyrand ............. 427/255.18 |
| 6,022,414 A | | 2/2000 | Miller et al. |
| 6,103,015 A | * | 8/2000 | Zhu ....................... C03C 17/002 |
| | | | 118/718 |
| 6,200,389 B1 | | 3/2001 | Miller et al. |
| 6,206,973 B1 | | 3/2001 | Bailey et al. |
| 6,485,783 B1 | | 11/2002 | Bailey et al. |
| 6,521,048 B2 | | 2/2003 | Miller et al. |
| 6,627,765 B2 | | 9/2003 | Giolando |
| 6,890,386 B2 | | 5/2005 | DeDontney et al. |
| 8,163,342 B2 | | 4/2012 | Stricker et al. |
| 8,398,770 B2 | | 3/2013 | Levy et al. |
| 2005/0011447 A1 | * | 1/2005 | Fink ............................. 118/715 |
| 2006/0127599 A1 | * | 6/2006 | Wojak ........................... 427/569 |
| 2009/0081885 A1 | | 3/2009 | Levy et al. |

FOREIGN PATENT DOCUMENTS

| | | |
|---|---|---|
| WO | 9806675 A1 | 2/1998 |
| WO | 02/46242 A2 | 6/2002 |
| WO | 2008/027085 A1 | 3/2008 |
| WO | 2013136052 A2 | 9/2013 |

\* cited by examiner

APPARATUS FOR DEPOSITING THIN FILM COATINGS AND METHOD OF DEPOSITION UTILIZING SUCH APPARATUS

RELATED APPLICATION

This application is claiming the benefit under 35 U.S.C. 119(e), of the provisional application filed Mar. 23, 2011 under 35 U.S.C. 111(b), which was granted Ser. No. 61/466, 501. This provisional application is hereby incorporated herein by reference, in its entirety.

BACKGROUND OF THE INVENTION

The invention relates to an apparatus for efficiently depositing thin film coatings on a substrate. More specifically, the invention relates to an apparatus which permits the deposition of certain thin films at commercially viable deposition rates and having desired properties, which heretofore have not been possible with conventional deposition apparatus.

Two categories of thin films have been known for some years. They are distinguishable in many ways, but for purposes of this application, the primary areas of distinction are (1) the method of deposition, i.e. on-line versus offline and (2) the types of films generally produced by such methods, respectively, hard coat (or pyrolytic) versus soft-coat.

On-line coatings are preferably produced by deposition of one or more thin film layers on, for example, a glass substrate during the glass manufacturing process, typically a continuous float glass manufacturing process. As a consequence of the characteristics of the float glass manufacturing process the thin film deposition process must take place at relatively high temperatures, with very short chemical reaction times, but at high deposition rates, in order to be commercially viable.

In a successful on-line coating operation, the thin films produced are relatively mechanically and chemically durable compared to most soft-coat films.

Off-line film deposition, typically, involves one of several known types of sputter coating processes, in which glass panels are placed in one or more coating chambers where the glass panel is exposed to an atmosphere created by the physical or chemical reaction of a "target" material so that it is deposited on a surface of the glass panel. As the sputtering process is not controlled by the speed of the glass manufacturing process, it may be possible to deposit more complex film stacks by sputtering processes, which film stacks may, in some instances have properties superior to those of pyrolytic thin films, but such sputtered films are also likely to be significantly more expensive to produce.

Apparatus for on-line coating are known in the patent literature, for example:

U.S. Pat. No. 4,446,815 describes a nozzle having three converging tuyeres which project the reagents in the gaseous phase onto a substrate. Deflector members are adapted to channel the gases between themselves and the substrate, extending on either side of the nozzle. The surface of a first deflector member extends in the opposite direction to the direction of movement of the substrate with respect to the nozzle, is parallel to the substrate, and forms an acute angle with the extended external wall of the third tuyere, so as to be transversely offset in the direction of substrate movement with respect to the axial median plane of the first tuyere. By contrast, the surface of the second deflector member forms a blunt edge with the corresponding longitudinal wall of the second tuyere. The opening of the nozzle between the edges of the first and second deflector members is therefore effectively bent, and the gases emerging therefrom are regularly deflected in the direction of movement of the substrate.

U.S. Pat. No. 4,834,020 describes a conveyorized atmospheric chemical vapor deposition apparatus having a heated muffle furnace and a conveyor belt for conveying objects to be coated through the furnace. At least one chemical vapor deposition zone is provided in the muffle furnace. An injector assembly is also provided for uniformly injecting first and second reactant gases in the deposition zone across the width of the conveyor belt and against the surfaces of the objects to be coated. The gases exit from slots connected to distribution plenums. Polished cooled surfaces are used on the injector assembly for the purpose of minimizing deposition of chemicals thereon.

U.S. Pat. No. 5,041,150 describes a process for coating a moving ribbon of hot glass by chemical vapor deposition by establishing a first flow of a first reactant gas along the hot glass surface substantially parallel to the direction of movement of the glass, and establishing a second flow of a second reactant gas as a turbulent flow at an angle to the glass surface, thus introducing said second flow into said first flow at said angle, while avoiding upstream flow of the second reactant gas in the first flow, and directing the combined first and second gas flows along the surface of the hot glass as a turbulent flow.

U.S. Pat. No. 5,122,391 describes an atmospheric pressure chemical vapor deposition system for doping indium oxide films with both tin and fluorine said to produce dual electron donors in a non-batch process. The deposition system has a conveyor belt and drive system for continuous processing through one or more reaction chambers separated by nitrogen purge curtains. A substrate passing through the system enters a muffle furnace heated by several heaters and the reaction chambers are supplied by a source chemical delivery system comprising an oxidizer source, a fluorine chemical source, a nitrogen source, rotometers for the above sources, a mass flow controller, a tin chemical bubbler, heated lines, an indium chemical bubbler, a pair of water baths with heaters, and associated valving.

U.S. Pat. No. 5,136,975 describes an injector of a type said to be used in atmospheric pressure chemical vapor deposition equipment. The injector includes a number of plates with a number of linear hole arrays. The plates are layered in order to produce a number of what are called cascaded hole arrays. The layered plates together are said to define a hole matrix. A chute is positioned beneath the hole matrix. On both sides of the chute is a cooling plate. The chute includes a passage and the regions between the cooling plates and the chute form ducts. The top of the hole matrix receives a number of gaseous chemicals and discretely conveys them to the top of the individual cascade hole arrays. The gaseous chemicals are then forced through the cascaded hole arrays which induces the gases to flow in an increasingly uniform manner. The gaseous chemicals are then individually fed to the passage and ducts which convey them to a region above the surface where the chemicals are exposed to one another, react and form a layer on a substrate surface.

U.S. Pat. No. 5,704,982 describes a nozzle for distributing at least one current of precursor gases onto a surface of a moving glass substrate by pyrolysis/decomposition reaction, includes a nozzle body, a principal gas feed system for feeding at least one current of precursor gases into the nozzle of the body, and an auxiliary gas feed system independent of the principal gas feed system, for feeding at least one of the precursor gases to the nozzle body in the proximity of the principal gas of the nozzle body for locally modifying the chemical composition of the principal gas. The auxiliary gas flow into the nozzle body is controlled at a flow rate which is variable in time.

U.S. Pat. No. 6,022,414 describes a single body injector for delivering gases to a surface. The injector is comprised of an elongated member with end surfaces and at least one gas delivery surface extending along the length of the member and which includes a number of elongated passages formed therein. Also formed within the member are a number of thin distribution channels which extend between the elongated passages and the gas delivery surface. Gases are conveyed to the elongated passages, through the distribution channels to the gas delivery surface where they are directed to a desired region where they mix, react and form a thin film on the substrate positioned beneath the injector. The gas delivery surface is comprised of rounded side regions and a center recessed region of the gas delivery surface.

U.S. Pat. No. 6,206,973 describes a chemical vapor deposition system including a heated muffle, a chamber having an injector assembly for introducing vaporized chemical reactants, and a belt for moving the substrate through the muffle and chamber. The belt has an oxidation-resistant coating to reduce formation of deposits thereon, particularly deposits of chromium oxides.

U.S. Pat. No. 6,521,048 describes a chemical vapor deposition apparatus comprising a deposition chamber and a main chamber. The deposition chamber comprises at least one single injector and one or more exhaust channels. The main chamber supports the deposition chamber and includes at least one gas inlet to inject at least one gas into the main chamber. The gases are removed through the exhaust channels, thereby creating an inwardly flowing purge which acts to isolate the deposition chamber. At least one so-called semi-seal is formed between the deposition chamber and the substrate so as to confine the reactive chemicals within each deposition region.

U.S. Pat. No. 6,890,386 describes an injector and exhaust assembly for delivering gas to a substrate comprising at least two injectors positioned adjacent each other and spaced apart to form at least one exhaust channel therebetween, and a mounting plate for securing the at least two injectors, wherein each of the at least two injectors are individually mounted to or removed from the mounting plate, the mounting plate being provided with at least one exhaust slot in fluid communication with the at least one exhaust channel. An exhaust assembly is coupled to the mounting plate to remove exhaust gases from the injectors.

SUMMARY OF THE INVENTION

The present invention relates to an apparatus for depositing a thin film on a moving heated substrate having a main coater body having a predetermined length, width and height designated as x, y, and z, respectively, and a upper surface z1 and a lower surface z2. A plurality of inlet openings are formed in the z1 surface of the main coater body to allow the flow of gaseous chemical reactants therethrough, each of the inlet openings being in fluid communication with a source of gaseous reactant material and/or inert gas. A plurality of outlet openings are formed in the z2 surface of the main coater body to allow the flow of gaseous reactants to exit therethrough in multiple predetermined flow paths, and a plurality of flow pathways are defined within the main coater body, one such flow pathway being defined between each of the inlet openings and a respective one of the outlet openings. A flow conditioning device disposed in one or more of the flow pathways.

A method of utilizing the above-described apparatus to deposit thin film coatings is also a part of the invention.

BRIEF DESCRIPTION OF THE DRAWINGS

The above, as well as other advantages of the present invention, will become readily apparent to those skilled in the art from the following detailed description when considered in the light of the accompanying drawings in which.

DETAILED DESCRIPTION OF THE INVENTION

The present invention relates to an apparatus for depositing thin film coatings on a substrate, for example, a transparent glass substrate. Preferably, thin film coatings such as metals, metal oxides and the like are deposited on a moving, heated glass substrate during the manufacture of the glass substrate, preferably by the float glass method. Preferably, the thin films are deposited by chemical vapor deposition, most preferably by atmospheric chemical vapor deposition. An example is the chemical vapor deposition of zinc oxide coatings as is described in U.S. patent application 61/466,498, the entire disclosure of which is hereby incorporated by reference.

Of course, any suitable CVD and/or APCVD chemistry can be practiced using the coating apparatus to deposit a selected thin-film coating. However, the coating apparatus is especially useful in delivering gaseous precursor compounds that substantially react upon mixing and/or before being discharged from known coating apparatuses. Gaseous precursor compounds known to substantially react upon mixing and/or before being discharged from other known coating apparatuses include, for example, $Zn(CH_3)_2$ and $H_2O$, $Zn(C_2H_5)_2$ and $H_2O$, $TiCl_4$ and $NH_3$, and $TiCl_4$ with certain amine compounds. As should be appreciated, the above-list of gaseous precursor compounds which are suitable for use with the coating apparatus described herein is not intended to be comprehensive. It should also be appreciated that the coating apparatus is not limited to use with gaseous precursor compounds that "pre-react" with each other. As such, gaseous precursor compounds which do not substantially react upon mixing with each other can be utilized with the coating apparatus. For example, gaseous precursor compounds suitable for use with the coating apparatus which do not substantially react upon mixing include, for example, $Sn(CH_3)_2Cl_2$ and $H_2O$.

The apparatus of the invention departs from known chemical vapor deposition apparatus which are designed to cause controlled premixing of various chemical constituents to create a uniform pre-mixture at a temperature below the reaction temperature of the mixture, to then react at or near the surface of the glass substrate on which the thin film is to be deposited, as the heated glass substrate is at a temperature above the reaction temperature of the premixed chemical reactants.

The deposition apparatus of the invention is, by contrast, designed to keep the various reactants apart from one another in the deposition apparatus but, by a variety of methods to be discussed, to nevertheless allow the chemical reactants to mix and react at or near the glass surface, rapidly enough to create a uniform film at commercially viable rates, and having properties falling within desired ranges, so as to be suitable for, for example, solar control coatings. Films deposited using the deposition apparatus also exhibit excellent uniformity of color and electrical conductivity, if desired.

More specifically, the main body of the deposition apparatus of the invention may be created from at least one block of a suitable material, preferably a metal material, having gaseous reactant inlet openings formed therein and connected to gaseous reactant outlet openings via a plurality of flow pathways, which are designed to keep the various streams apart from one another in the coating apparatus. Preferably, the gaseous reactant outlet openings are slot-like in configuration; i.e. have a length greater than the width of each outlet opening. Preferably, the slots are arranged in a parallel and spaced apart relationship one to the other. The gaseous reactant outlet openings may be of the same or different dimensions, one from the other.

Figure 8:
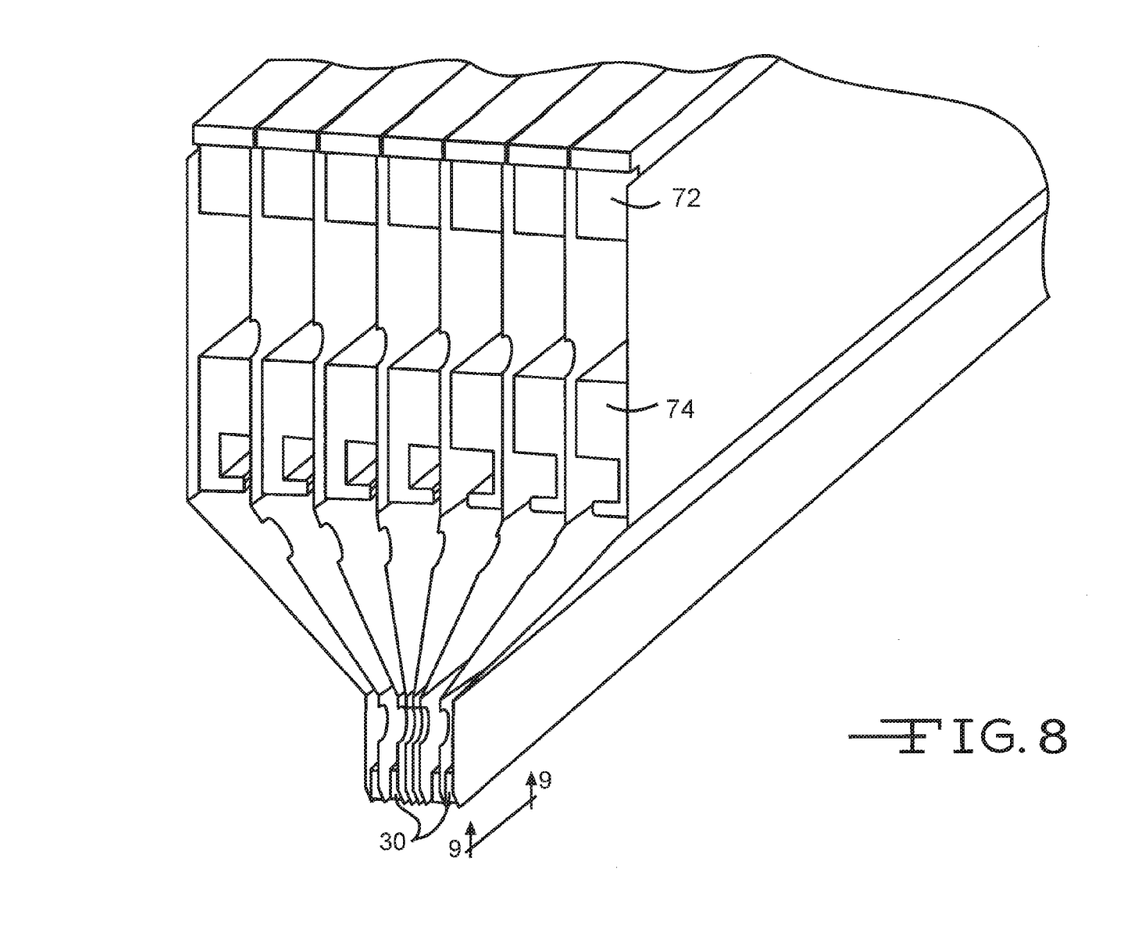
FIG. 8 shows a perspective view of a portion of a coating apparatus according to an embodiment of the invention.

In an embodiment, at least one of the flow pathways may be substantially straight. In other embodiments, at least one of the flow pathways has a portion or portions which are substantially straight. In still further embodiments, at least one of the flow pathways may have a bend connected to or connecting substantially straight portions of the flow pathway. In these embodiments, the flow pathway may have a plurality of bends. In still further embodiments, the flow pathways are configured so that they are nearly identical in shape, length, and width. However, as depicted in FIG. 8, the widths of certain flow pathways may be the same or different from an adjacent flow pathway.

One or more gas flow conditioning devices may be placed in one or more of the flow paths between the gaseous reactant inlet openings and the gaseous reactant outlet openings. Such flow conditioning device(s) may increase the laminarity of the gas flow from one or more of the gaseous reactant outlet openings.

The distance of the separation between the gaseous reactant outlet openings may be uniform, or may differ between one outlet opening and adjacent outlet openings.

In order to further ensure that the gaseous reactant flow streams remain separated until it is desired that they react, at or near the glass substrate surface, at least one gas discharge director may assist in directing the flow of gaseous reactant in a defined pattern toward the surface of the glass substrate. Streams of inert gas may also be utilized to keep chemical reactant gas flow streams separate until reaction thereof is desired.

The velocity of the flow of gaseous reactant from each gaseous reactant outlet opening may be utilized as a means of controlling the degree of turbulence of the combined discharges from the gaseous reactant outlet openings, thus having a significant influence on film deposition rates and uniformity of film thickness. Thus, gas flow velocity may be the same or different from one gaseous reactant outlet opening to the next adjacent outlet opening, depending on the objective desired.

It is preferred that the temperature of the apparatus be controlled within predetermined ranges, by known methods, particularly in the area of the gaseous reactant outlet opening. Such desired temperature ranges may depend on one or more factors, for example, the particular chemical reactants being processed by the apparatus.

Referring to the drawing figures, the present deposition apparatus 10 is designed to maintain one or more active gaseous chemical reactants in discrete flow paths in the deposition apparatus 10 and, in certain embodiments, even to control the flow path geometry for a time/distance once the at least one gaseous reactant has been discharged from the main body 12 of the deposition apparatus 10. By methods to be discussed, the apparatus of the invention nevertheless allows the chemical reactants to mix and react, at or near the glass substrate deposition surface 14, rapidly enough to create a uniform film on the substrate deposition surface 14 at commercially viable rates, for example, at or above 5 nm/sec, preferably at or above 50 nm/sec, and perhaps even at 350 nm/sec or above, and having desired properties so as to be suitable for solar control, low emissivity or transparent conductive, thin film coatings, as examples.

Figure 4:
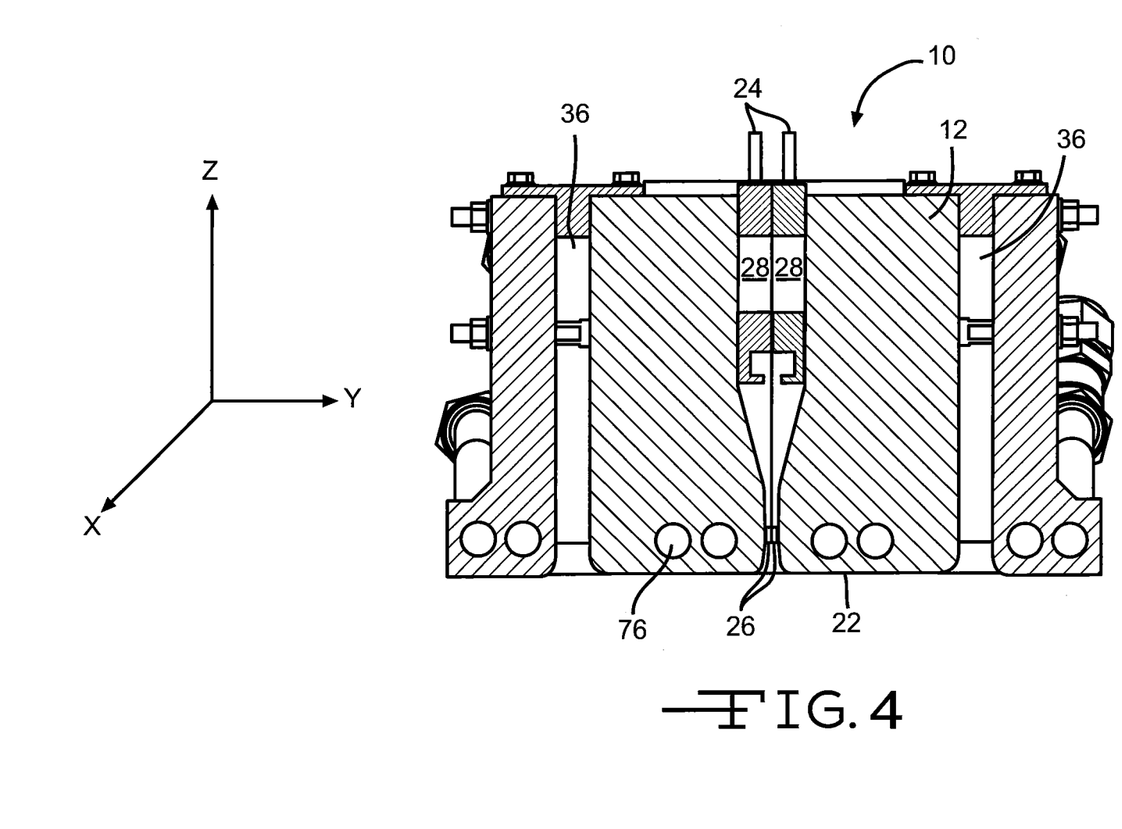
FIG. 4 shows a cross-sectional view of a coating apparatus according to an embodiment of the invention.

The main body 12 of the deposition apparatus 10 of the invention may be created from at least one block of a suitable material, for example, a metal such as high grade steel or steel alloys, although other materials and methods of forming the main body 12 of the apparatus 10 capable of withstanding the environment of a glass float bath may be possible. As shown in FIG. 4, the various faces of the main body are conventionally designated as x 16, y 18, and z 20, 22 (z1 and z2). One or more gaseous reactant inlet openings 24 are formed by any suitable method in upper face z1 20. The one or more gaseous reactant inlet openings may have any desired geometric shape. Preferably, a plurality of such gaseous reactant inlet openings 24 are so formed in the z1 face 20 of the apparatus 10. In certain embodiments, so-called "cover blocks" 72 may be disposed in one or more flow pathways 28, as shown for example in FIG. 5. Such cover blocks 72 may be used to restrict flow in a desired manner within the individual flow path 28. As such, it may be preferable for such cover blocks 72 to be located in a portion of one or more flow pathways 28 proximate one or more gaseous reactant inlet openings 24.

As will be discussed in more detail, at least one gaseous reactant outlet opening 26 is formed in, or proximate, the lower or z2 face 22 of the main body 12 of the deposition apparatus 10. At least one discrete flow pathway 28 extends through the main body 12, flowingly connecting the at least one gaseous reactant inlet opening 24 to at least one gaseous reactant outlet opening 26. Preferably, a plurality of discrete flow pathways 28, for example, 3, 5, 7, or 9 flow pathways 28, extend through the main body 12 of the apparatus 10 connecting the plurality of gaseous reactant inlet openings 24 to the plurality of gaseous reactant outlet openings 26. Such flow pathways 28 may have any desired geometric configuration.

Figure 5:
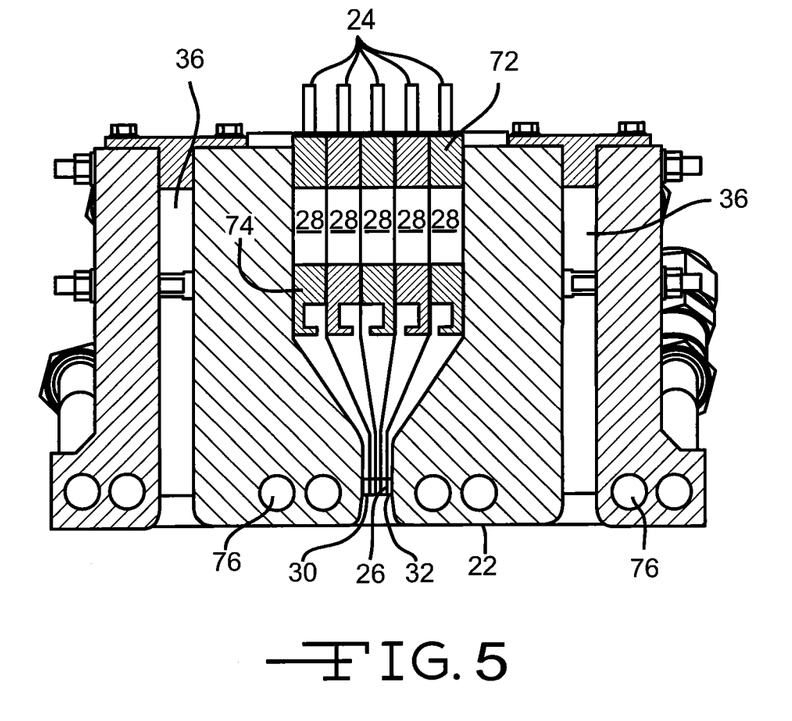
FIG. 5 shows a cross-sectional view of a coating apparatus according to an embodiment of the invention.

In certain embodiments of the deposition apparatus 10, a "baffle block" 74 may be located in one or more flow pathways 28, as shown, for example, in FIG. 5. Preferably, the baffle block, if present, is located in the flow pathway 28 between cover block 72 and flow conditioner 30. Preferably, a baffle block is located in each flow pathway. The baffle block 74 is intended to increase the uniformity of the gaseous reactant stream within the flow pathway 28.

While the gaseous reactant outlet openings 26 may have any desired shape, they are preferably slot-like in configuration; that is, they are preferably greater in the "x" dimension of the main body 12 of the deposition apparatus 10 than in the "y" dimension of the main body 12 of the deposition apparatus 10. Preferably, the slot-like gaseous reactant outlet openings 26 are arranged in parallel, spaced apart relationship one to another. Any desired number of gaseous reactant outlet openings 26 may be utilized, however, 3, 5, 7 or 9 outlet openings 26 are preferred. Separation distances between such outlet openings 26 may, typically, be about 0.5 mm-3 mm. Preferred separation distances between the gaseous reactant outlet openings 26 are no more than about 1 mm, and more preferably, such separation distances are about 0.5 mm.

The gaseous reactant outlet openings 26 may be formed in the z2 face 22 of the main body 12 of the deposition apparatus 10, or alternatively, may be recessed a predetermined distance, for example, up to about 5.5 mm into the main body 12 of the deposition apparatus 10. It has been found to be advantageous to recess the gaseous reactant outlet openings 26 to afford a degree of protection to the gas discharge portion of the deposition apparatus 10 from the heat emanating from the molten tin bath and the hot glass substrate deposition surface 14. Such temperatures may be on the order of 1050° F. (566° C.)-1400° F. (750° C.). Preferably glass surface temperatures are between 1100° F. (600° C.) and 1200° F. (650° C.).

The gaseous reactant outlet openings 26 may differ in size, particularly in the "y" dimension of the main body 12 of the deposition apparatus 10. It has been found to be advantageous, in some instances, for gaseous reactant outlet openings 26 discharging inert gases to be larger in the "y" dimension, i.e. width of the outlet opening, than the gaseous reactant outlet openings 26 discharging active gaseous chemical reactants.

Figure 9:
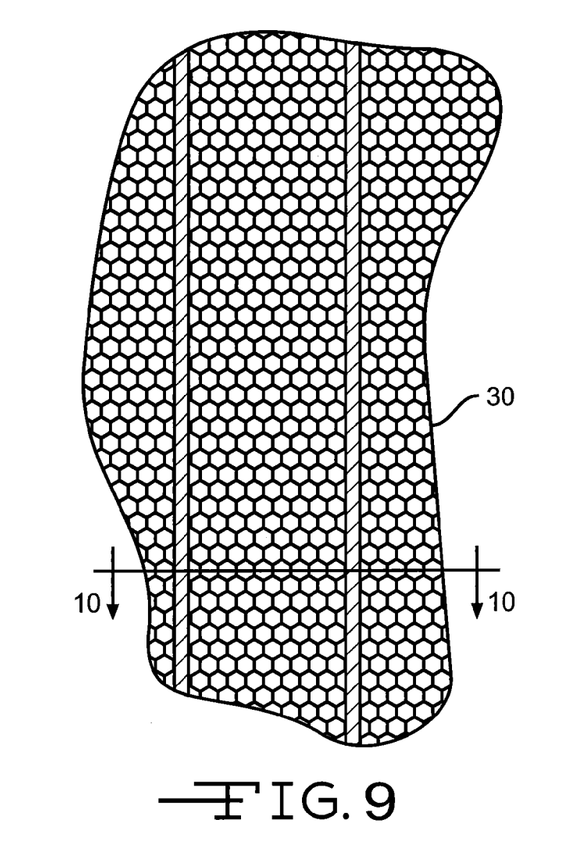
FIG. 9 shows an enlarged view of a portion of the coating apparatus shown in FIG. 8 according to an embodiment of the invention.

One or more gas flow conditioning devices 30 may be affixed in one or more of the gas flow pathways 28 extending between the at least one gaseous reactant inlet opening 24 and the at least one gaseous reactant outlet opening 26. Such gas flow conditioning devices 30 are intended to increase the laminarity of the one or more gas discharge streams from the one or more gaseous reactant outlet openings 26. A "honeycomb" configuration as shown in FIG. 9 is preferred for the one or more gas flow conditioning devices 30. While other areas are, of course, possible, preferred areas of the cells of the honeycomb are about 1 square millimeter. The preferred vertical dimension (thickness) of the honeycomb may preferably be about 5 mm to about 25 mm.

Figure 6:
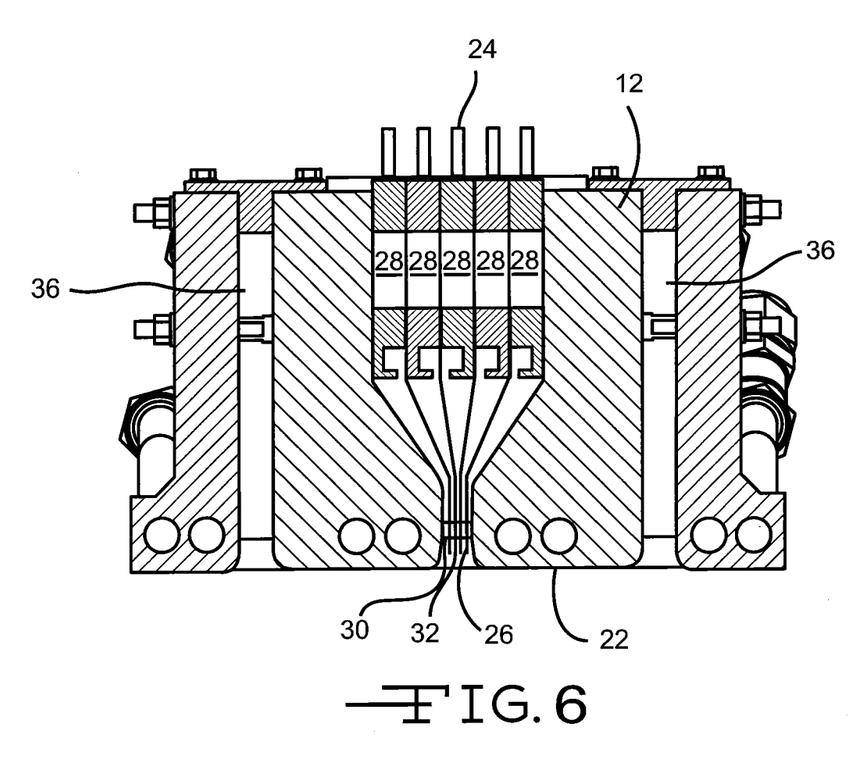
FIG. 6 shows a cross-sectional view of a coating apparatus according to an embodiment of the invention.
Figure 7:
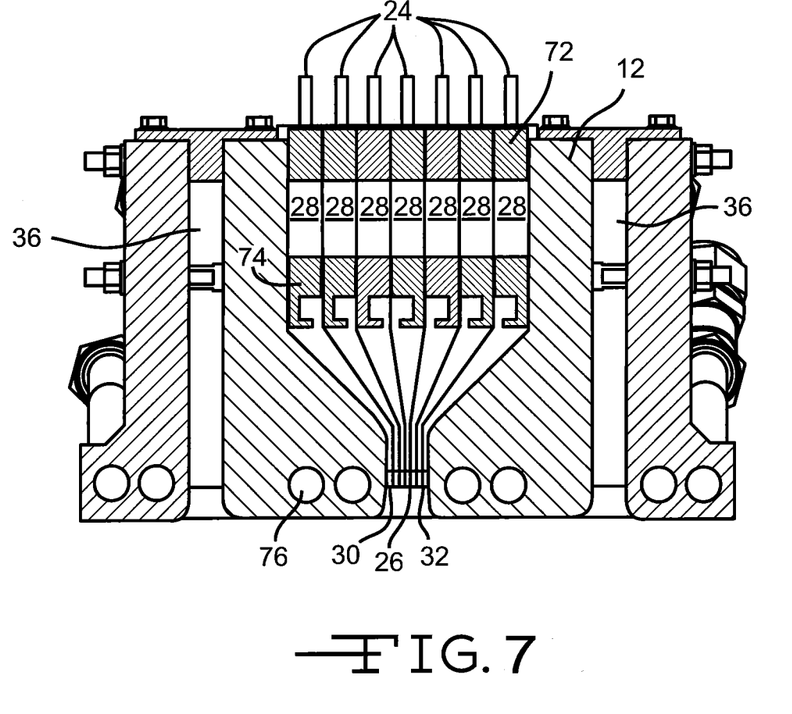
FIG. 7 shows a cross-sectional view of a coating apparatus according to an embodiment of the invention.

In order to further ensure that the gaseous reactant flow streams and inert gas flow streams remain separate until it is desired that they react, at or near the glass substrate deposition surface 14, at least one gas discharge director 32 may define a portion of one or more of the flow pathways and in certain embodiments, as shown in FIG. 6, may extend on either side of the gaseous reactant outlet opening 26 for a distance beyond outlet opening 26, to direct the flow of gaseous reactant in a defined pattern toward the deposition surface 14 of the glass substrate. The size and location of the zone wherein the gaseous reactants mix and the mechanism by which such mixing occurs may vary in the several embodiments of the invention. For example, mixing of gaseous reactants by diffusion may occur at or near the flow conditioners, at or near the z2 face of the deposition apparatus 10, and at or near the substrate depositions surface 14. In the embodiments where the at least one gas discharge director extends beyond gaseous reactant outlet opening 26, the at least one gas discharge director 32 is a thin projection, preferably of a thin metal material, extending from the main body 12 of the deposition apparatus 10 proximate the one or more gaseous reactant outlet opening 26 toward, and preferably within about 5.5 mm of, the deposition surface 14 of the heated moving glass substrate. Streams of inert gas from one or more inert gaseous reactant outlet openings 26 located adjacent one or more gaseous chemical reactant outlet openings 26 may also be utilized to keep gaseous chemical reactant flow streams separate until reaction thereof is desired.

The velocity of the flow of gaseous reactant from each gaseous reactant outlet opening 26 may be utilized as a means of controlling the degree of turbulence of the combined discharges from the gaseous reactant outlet openings 26, thus having a significant influence on film deposition rates and uniformity of film thickness. Thus, gas flow velocity may be the same or different from one gaseous reactant outlet opening 26 to adjacent outlet openings 26 depending on the objective desired. Preferably, however, gas flow velocities are substantially equal from one gaseous outlet opening 26 to the next.

The apparatus of the invention also advantageously includes one or more gaseous exhaust openings 36 extending through the main body 12 of the deposition apparatus 10 to allow for the continuous removal of spent or unused gaseous reactants which might otherwise create undesired contaminants on the deposition surface of the substrate 14. Such gaseous exhaust extraction may also be utilized to influence the amount of gas flow turbulence and reactant mixture which occurs at or near the deposition surface of the heated glass substrate, thus having the potential to enhance the rate of thin film deposition.

It is preferred that the temperature of the deposition apparatus 10 be controlled within predetermined ranges by any known method, particularly for the area proximate and including the at least one gaseous reactant outlet opening 26. For example, methods of temperature control preferably include oil and water cooling, although air cooling may also be possible. Representative cooling material passages 76 are shown, for example, in FIGS. 4-7. One skilled in the art will appreciate that various thermal and electronic devices are generally necessary to implement such temperature control systems. Desired ranges for temperature control of the apparatus 10 may depend on one or more factors, for example, the particular chemical reactants being processed by the deposition apparatus 10, but typically it is preferred to control the temperature of the apparatus within a range of ±50° F. (±10° C.). Among other advantages, such temperature control system has been found to maintain the thermal stability and structural integrity of components associated with the gaseous discharge portion of the deposition apparatus 10, for example, the gas discharge directors 32. Prevention of chemical pre-reaction is also an objective of the temperature control system.

As previously described herein, the main body 12 of the apparatus 10 of the invention may be formed from at least one block of, preferably, a metal material. It may be advantageous to assemble the main body of the apparatus from a plurality of metal blocks. Advantages of utilizing multiple metal blocks include, for example, easier construction and maintenance, better temperature control of individual areas of the deposition apparatus 10, as well as enhanced structural and thermal stability of the deposition apparatus 10.

The apparatus 10 of the invention has been described. Now a method of utilizing the deposition apparatus 10 to deposit a thin film coating will be described. In a float glass manufacturing process, as described elsewhere herein, and more particularly in the float bath portion of the float glass manufacturing process, at least one thin film deposition apparatus 10, according to the invention, is located a predetermined distance above the deposition surface 14 of the continuous moving glass substrate supported on the bath of molten tin.

Separate supply lines extend from at least one source of a gaseous chemical reactant and, similarly, from at least one source of an inert gas, preferably located outside of the float bath, to separate gaseous inlet openings 24 in the main body 12 of the deposition apparatus 10. A flow of the at least one gaseous chemical reactant and at least one inert gas, at predetermined flow rates is initiated and is conveyed through the supply lines to the at least one gaseous inlet opening 24 where they flow at a predetermined velocity through the discrete flow pathways 28 extending through the main body 12 of the deposition apparatus 10.

Figure 10:
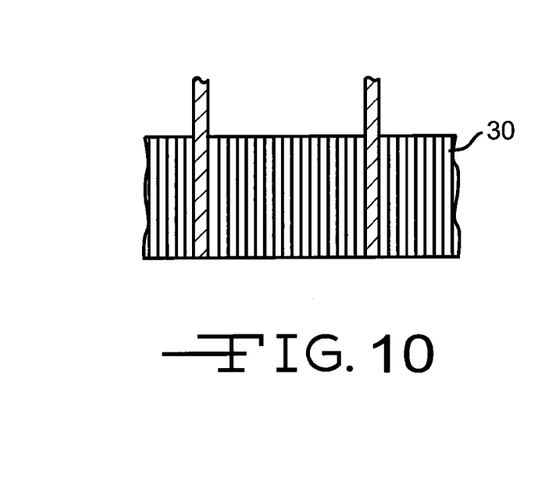
FIG. 10 shows a cross-sectional view of the portion of the coating apparatus shown in FIG. 9 according to an embodiment of the invention.

Preferably, at a predetermined location in each gas flow pathway 28, the at least one gaseous reactant and at least one inert gas contact a flow conditioning device 30 intended to increase the laminarity of each separate gas flow pathway 28. Preferably, the at least one flow conditioning device 30 is of a "honeycomb" configuration as shown in FIG. 9, although other configurations are possible. The dimensions of the cells of the honeycomb may also vary in size and shape. The vertical dimension or "thickness" of the flow conditioning device 30 as shown in FIG. 10 is also variable depending upon the extent to which laminarity of the flow of a particular gaseous stream is desired to be altered.

After preferably having passed through the at least one flow conditioning device 30, the gases flowing through the separate gas flow pathways 28 approach their respective separate gaseous outlet openings 26, each preferably having a slot-like configuration. In certain embodiments the at least one flow conditioning device is proximate gaseous outlet opening 26. Alternatively, upon discharge from the separate gaseous outlet openings 26, in certain embodiments of the deposition apparatus, the discrete flows of gaseous chemical reactant and inert gas are further directed in still-separated flow paths toward the deposition surface of the substrate 14 by at least one gas discharge director 32, as previously described herein. It has been found to be advantageous to control the temperature of the deposition apparatus 10, particularly, in the area proximate the gaseous reactant outlet openings 26 preferably within a range of ±50° F. (±10° C.), for the reasons previously discussed.

At or near the deposition surface 14 of the moving, heated glass substrate, the separate gas flow streams are mixed in a desired mixing zone and chemically react in a predetermined manner, such reaction resulting in the deposition of a thin film on the deposition surface of the moving, heated glass substrate 14 at commercially viable deposition rates.

As previously noted, the method of the present invention is generally practiced in connection with the formation of a continuous glass ribbon substrate. It is contemplated that the active gaseous reactants will be combined at, or very near, the surface 14 of the glass. A carrier gas or diluent, for example, nitrogen, air or helium, will normally also be included in the gas mixture. The gaseous mixture is delivered to the mixing zone at a temperature below the temperature at which it reacts to form the thin film coating, the substrate surface 14 being at a temperature above the reaction temperature. The present invention permits the production of thin film coatings at commercially viable deposition rates, preferably at or above 5 nm/sec, more preferably at or above 50 nm/sec, and perhaps even at 350 nm/sec or above. High deposition rates are important when depositing thin films on a glass substrate in a glass manufacturing process, as the glass ribbon is travelling at a line speed in the range of several hundred inches per minute and a thin film of a specific thickness must be deposited in fractions of a second. For any particular combination of reactants, the optimum concentrations and flow rates for achieving high deposition rates may be determined by trial, or by computer modeling. It will be appreciated that the use of higher concentrations of reactants and high gas flow rates is likely to result in less efficient overall conversion of the reactants into a thin film, so that the optimum condition for commercial operation may differ from the conditions which provide the highest deposition rates.

A float glass manufacturing installation may be utilized as means for practicing the method of the present invention. The float glass installation described herein is illustrative of such installations, and is not limiting as to the invention.

Figure 1:
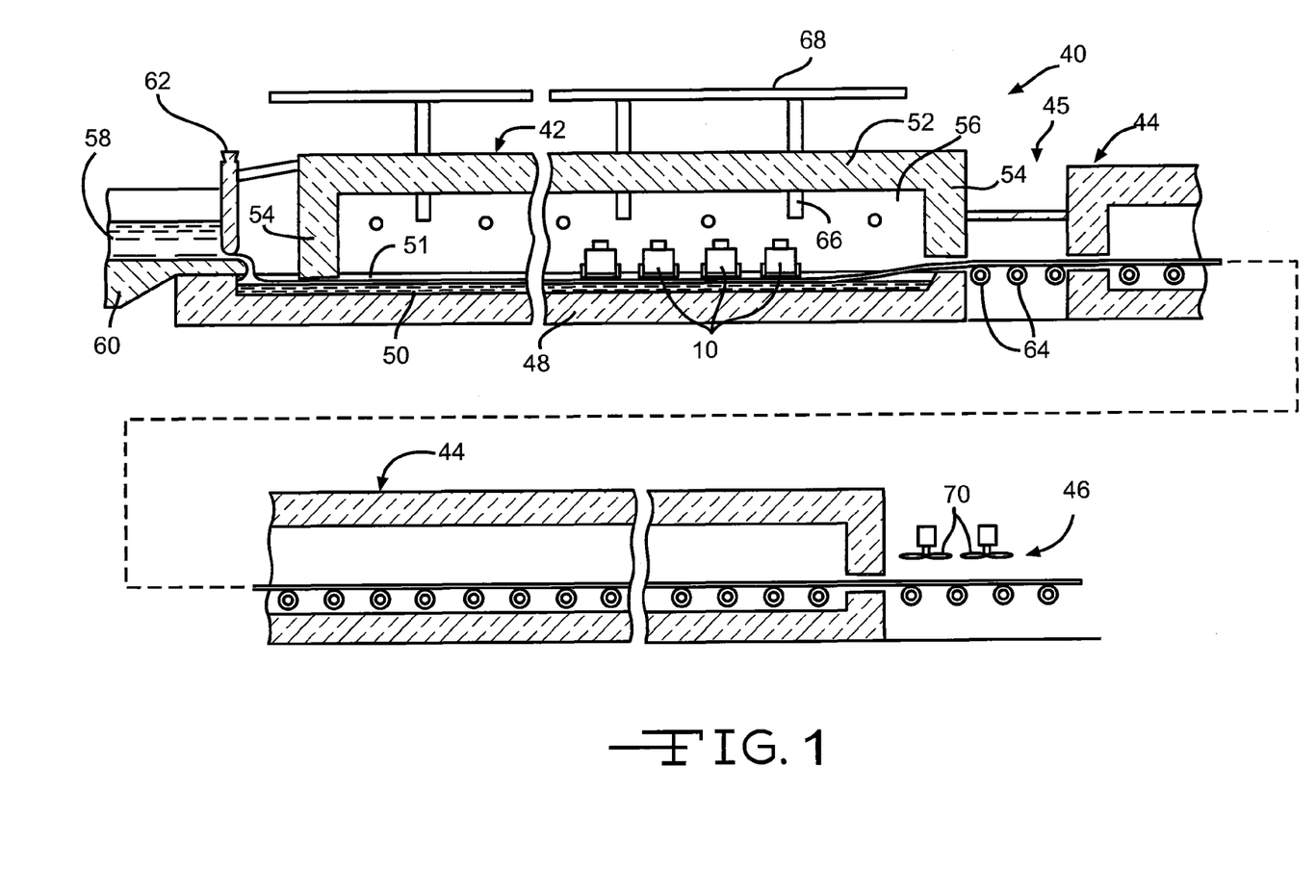
FIG. 1 shows a schematic view of a float glass manufacturing operation with thin film coating apparatus of the invention.
Figure 2:
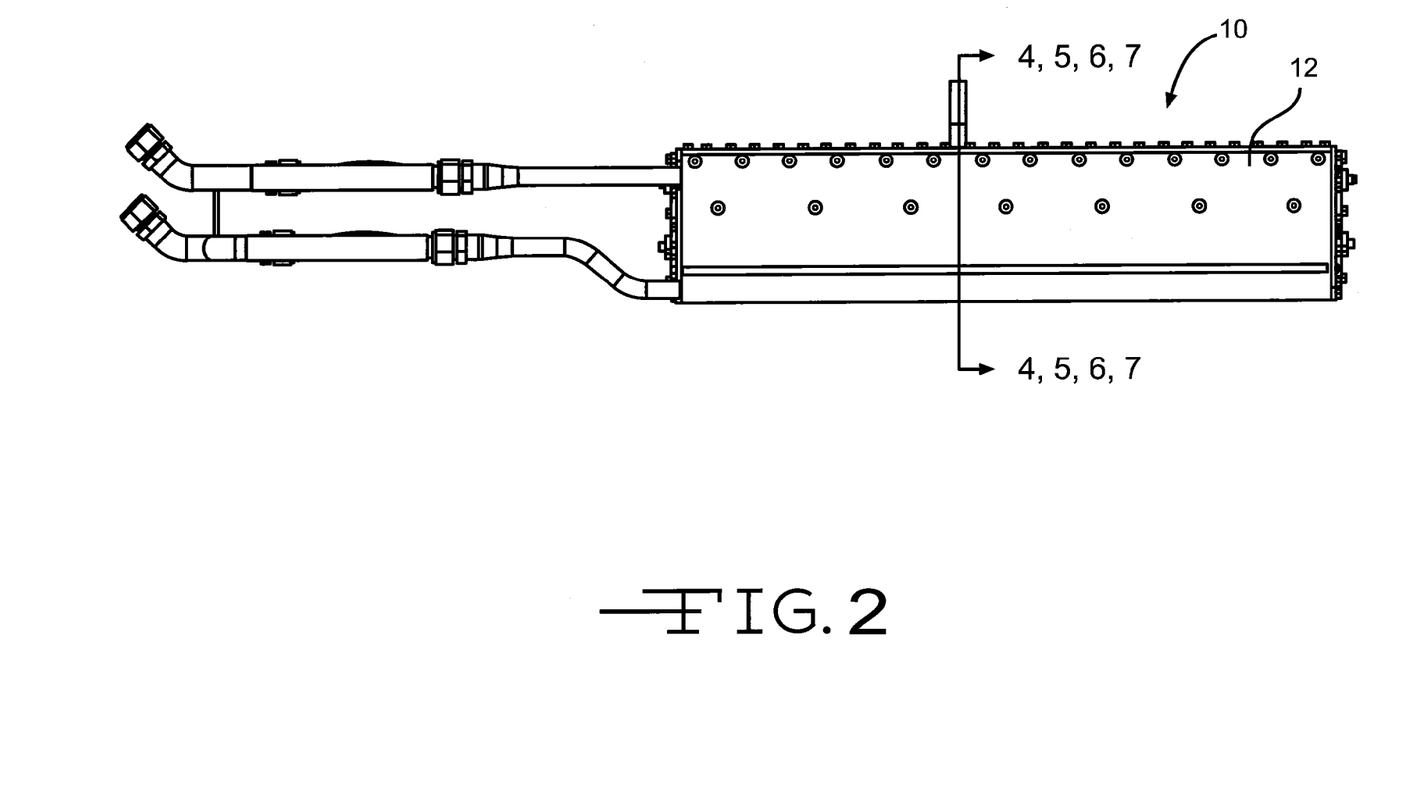
FIG. 2 shows a front plan view of a coating apparatus according to an embodiment of the invention.
Figure 3:
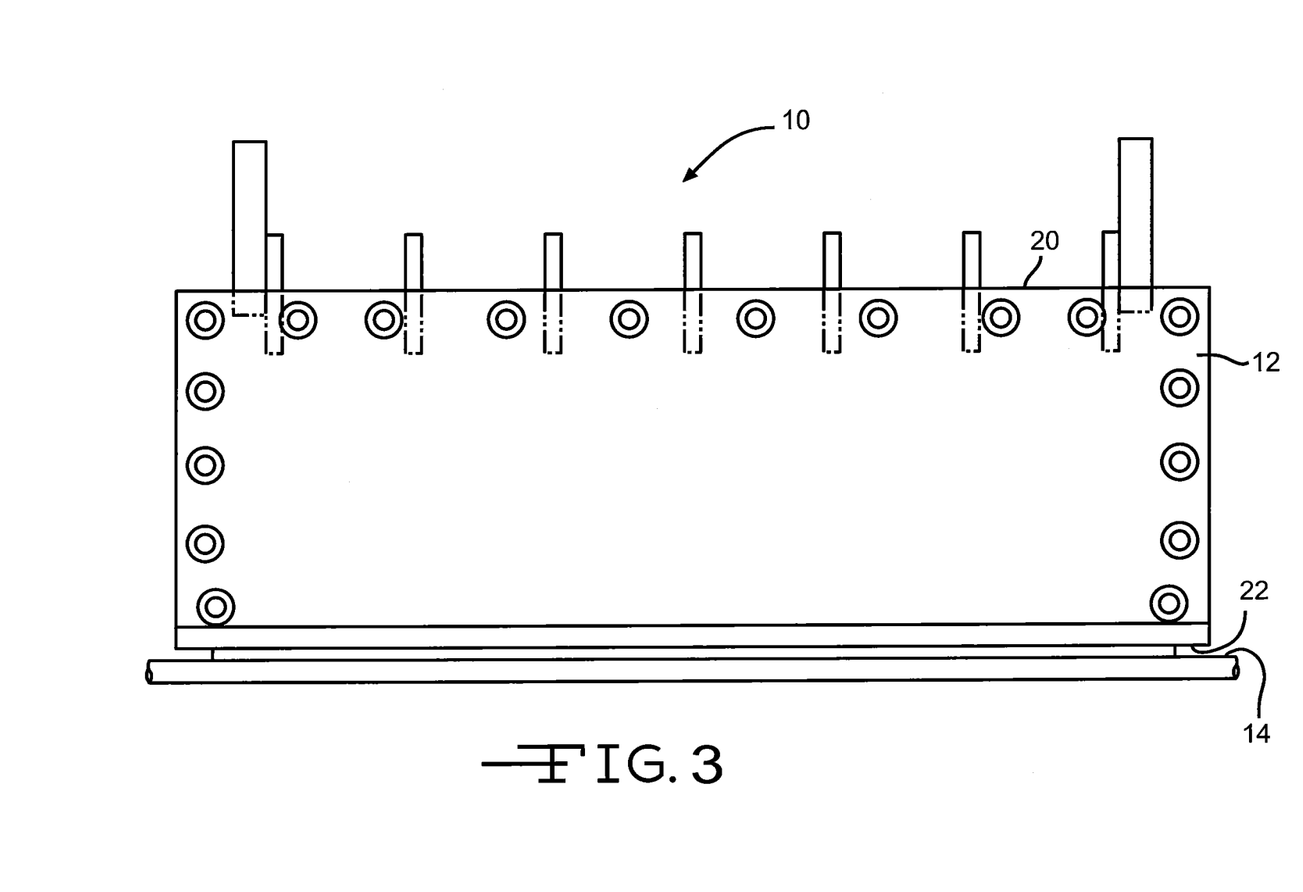
FIG. 3 shows an end plan view of a coating apparatus according to an embodiment of the invention.

The float glass installation as illustrated in FIG. 1 more particularly comprises a canal section along which molten glass is delivered from a melting furnace, to a float bath section 42 wherein a continuous glass ribbon 51 is formed in accordance with the well-known float process. Temperatures in the float bath section are typically between 1050° F. (566° C.) and 1400° F. (750° C.). Preferably, temperatures are between 1100° F. (600° C.) and 1200° F. (650° C.). The glass ribbon 51 advances from the bath section 42 through an adjacent annealing lehr 44 and a cooling section 46. The continuous glass ribbon 51 is preferably the substrate on which the thin films are deposited by the apparatus 10 of the present invention. The float bath section 42 includes: a bottom section 48 within which a bath of molten tin 50 is contained, a roof 52 opposite sidewalls (not shown) and end walls 54. The roof 52, sidewalls and end walls 54 together define an enclosure 56 in which a non-oxidizing atmosphere is maintained to prevent oxidation of the molten tin 50.

In operation, the molten glass flows along the canal beneath a regulating tweel and downwardly onto the surface of the tin bath 50 in controlled amounts. On the molten tin surface 50, the molten glass spreads laterally under the influence of gravity and surface tension, as well as certain mechanical influences, and it is advanced across the tin bath 42 to form the glass ribbon 51. The glass ribbon 51 is removed from the tin bath section 42 over lift out rolls 64 and is thereafter conveyed through the annealing lehr 44 and the cooling section 46 on aligned rolls. The deposition of the thin film of the invention preferably takes place in the float bath section 42, although it may be possible for deposition to take place further along the glass production line, for example, in the gap 45 between the float bath 42 and the annealing lehr 44, or in the annealing lehr 44.

A suitable non-oxidizing atmosphere, generally nitrogen or a mixture of nitrogen and hydrogen in which nitrogen predominates, is maintained in the float bath enclosure 56 to prevent oxidation of the molten tin comprising the tin bath 50. The atmosphere gas is admitted through conduits 66 operably coupled to a distribution manifold 68. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. For purposes of the present invention, the above-noted pressure range is considered to constitute normal atmospheric pressure. Heat for maintaining the desired temperature regime in the tin bath 42 and the enclosure 56 is provided by radiant heaters within the enclosure 56. The atmosphere within the lehr 44 is typically atmospheric air, as the cooling section 46 is not enclosed and the glass ribbon 51 is therein open to the ambient atmosphere. Ambient air may be directed against the glass ribbon as by fans 70 in the cooling section. Heaters may also be provided within the annealing lehr 44 for causing the temperature of the glass ribbon 51 to be gradually reduced in accordance with a predetermined regime as it is conveyed therethrough.

EXAMPLES

The deposition apparatus has been used to deposit coatings on a glass substrate transported through a belt conveyor furnace, more specifically, a three zone furnace, having a substrate heating zone, a coating zone, and a cool down zone. Sheets of soda-lime silica glass and soda-lime silica glass with a previously deposited silica barrier layer thereon were loaded onto the conveying belt which passed through the furnace, allowing the glass temperature to reach 650° C. before entering the coating zone. The heated glass substrate was then passed under the deposition apparatus which was located approximately 4 mm above the surface of the glass substrate. Deposition was conducted at line speeds of between 0.5 and 3 meters/minute on glass sheets having dimensions of 100×300 mm and a thickness of 3 mm. The deposition apparatus was maintained at a temperature of 150° C. Substantially all of the input spent/unused gases were exhausted from the coating zone so as not to interfere with the deposition process. As used in the following Examples, "slot" may be considered to be equivalent to gaseous flow pathway 28, exiting the deposition apparatus through corresponding gaseous reactant outlet opening 26.

Example 1

Zinc Oxide Deposition with Additive Compound Using a 5 Slot Coater

With Slot 1 being at the left side of the coater and Slot 5 being at the right side of the coater, the precursor inputs to each of the slots were as follows:

Slot 1 and Slot 5—These two slots conveyed a mixture of $N_2$ plus $H_2O$ (in the form of steam). For simplicity, a single evaporator was used to create a steam and $N_2$ mixture which was equally divided and delivered as such to Slots 1 and 5. To avoid condensation, all reactant delivery lines were maintained at above the dew point. The steam and $N_2$ mixture was generated by injecting water into a heated evaporator. $N_2$ carrier gas was added to the evaporator to convey the steam and $N_2$ mixture to Slots 1 and 5. 10 ml/min of water was injected into the evaporator and the amount of $N_2$ added to the evaporator was such that the total flow of $N_2$+steam was equal to 20 slm, with 10 slm going to each of Slots 1 and 5.

Slot 2 and Slot 4—A metered flow of 10 slm of $N_2$ carrier gas was fed down each of Slots 2 and 4.

Slot 3—The gaseous reactant flow through Slot 3 was modified to comprise a mixture of dimethyl zinc (DMZ) and an additive compound, namely acetyl acetonate. Two bubblers were used to generate a mixture of the two chemicals. The DMZ precursor mixture was generated by using a standard bubbler maintained at a temperature of 36° C. By passing a flow of He through the bubbler, 0.077 mol/min of gaseous DMZ was evaporated. The second, acetyl acetonate bubbler was maintained at a temperature of 60° C. $N_2$ gas was passed through the second bubbler to generate a flow of acetyl acetonate. The two chemicals were premixed in a pipe, and additional $N_2$ added to create a total gas flow through Slot 3 of 10 slm.

Under these conditions, glass sheets were moved under the coater at a line speed of 1.8 m/min. A 450 nm thick zinc oxide film was deposited at a deposition rate of 68 nm/sec, the coated glass exhibiting haze of 4.8% and high visible light transmission of 76%.

Example 2

Ga Doped Zinc Oxide Deposition with Additive Compound Using a 5 Slot Coater

Using the experimental conditions described above in connection with Example 1, a gaseous mixture of $N_2$+$H_2O$ was fed through Slot 1 and Slot 5. 24 ml/min of water was injected into the evaporator and 0.5 slm of $N_2$ was added. The gaseous reactant flow through Slot 3 was modified to comprise a mixture of DMZ, acetyl acetonate and a dopant compound, namely trimethyl gallium (TMG). Three bubblers were used to generate a mixture of the three chemicals. The DMZ bubbler and the acetyl acetonate bubbler were operated as described in Example 1. DMZ was transported through the first bubbler by He so that 0.077 mol/min of DMZ was evaporated. The second, trimethyl gallium bubbler was maintained at a temperature of 10° C. $N_2$ gas was passed through the second bubbler to generate a flow of gallium. The three precursors were premixed in a pipe and additional $N_2$ added to create a total gas flow through Slot 3 of 10 slm. Under these conditions, glass sheets were moved under the coater at a line speed of 3.0 m/min where an electrically conductive zinc oxide coating having a thickness of 200-230 nm and exhibiting a resistivity on the order of $1 \times 10^{-3}$ ohm cm was deposited at a deposition rate of 50-60 nm/sec. It will be appreciated that by varying the composition of the DMZ/dopant mixture, films having higher and lower resistivities can be produced. For example, a resistivity of $1.3 \times 10^{-2}$ ohm cm was exhibited by a film deposited using a gas phase of 0.002 mol/min of TMG while a resistivity of $4.3 \times 10^{-3}$ ohm cm was exhibited by the coated glass using a gas phase of 0.004 mol/min of TMG. These coated glasses also exhibited high visible light transmission of 60-70%, low IR radiation absorption of 13-20%, and low haze of 0.6-1.1%. By way of contrast, with no acetyl acetonate additive, films with much higher resistivities of $3.9 \times 10^{-1}$ ohm cm and $9.3 \times 10^{-2}$ ohm cm were obtained with the same amounts of TMG as noted above, respectively.

Example 3

Ga Doped Zinc Oxide Deposition with Additive Compound Using a 7 Slot Coater

Example (3-1)

A similar naming convention as with Example 1, 2, and 3 is used for the slots of the 7 slot coater, with Slot 1 and 7 being at the left and right extremity of the coater, respectively.

Slot 1 and Slot 7—These two slots were utilized in this example to convey a mixture of $N_2+H_2O$ (in the form of steam). As in Example 1, a single evaporator was used to create a steam and $N_2$ mixture, which was equally split between Slots 1 and 7. Again all precursor delivery lines were maintained at above the dew point. 6 ml/min of water was injected into the evaporator. $N_2$ was again used as a carrier gas for the steam and $N_2$ mixture. Total flow was again 20 slm with 10 slm of the steam and $N_2$ mixture flowing down each of Slots 1 and 7.

Slots 2, 3 and 5, 6—A metered flow of 5 slm of $N_2$ carrier gas was fed down each of slots 2, 3 and 5, 6 to ensure separation between the chemical mixture flowing down Slot 4 and those flowing down Slots 1 and 7.

Slot 4—This slot was again utilized to convey a precursor mixture of dimethyl zinc (DMZ), acetyl acetonate and trimethyl gallium (TMG). A standard bubbler at 36° C. was again used to create gaseous DMZ and transported through the bubbler by He so that 0.077 mol/min of DMZ was evaporated. A second standard bubbler at 60° C. was again used to create gaseous acetyl acetonate which was transported through the bubbler by $N_2$. The third standard bubbler at a temperature of 10° C. was again used to create gaseous TMG and was transported through the bubbler by He so that 0.005 mol/min of TMG was evaporated. The three chemicals were premixed in a pipe and additional $N_2$ added to create a total gas flow through Slot 4 of 10 slm. Under these conditions, glass sheets were moved under the coater at a line speed from 0.5 to 3.0 m/min where an electrically conductive zinc oxide coating having a thickness of 280-1420 nm was deposited at a deposition rate of 60-70 nm/sec, the coating exhibiting a resistivity <$1\times10$-3 ohm cm. Other properties exhibited by the coated glass include high visible light transmission >71%, and low haze <2.0%. Again, it will be appreciated that by varying the composition of the DMZ/dopant mixture, films having higher and lower resistivities can be produced.

Example (3-2)

Slot 1 and Slot 7—A metered flow of 10 slm of $N_2$ carrier gas was fed down each of these slots to enhance mixing of the flows in Slot 2 and Slot 6.

Slot 2 and Slot 6—These two slots were utilized in this example to convey a mixture of $N_2+H_2O$ (in the form of steam) in the same way as in Example 4-1. A single evaporator was used to create a steam and $N_2$ mixture, which was equally split between Slots 2 and 6. Again all precursor delivery lines were maintained at above the dew point. 6 ml/min of water was injected into the evaporator. $N_2$ was again used as a carrier gas for the steam and $N_2$ mixture. Total flow was again 20 µm with 10 slm of the steam and $N_2$ mixture flowing down each of Slots 2 and 6.

Slots 3 and Slot 5—A metered flow of 10 slm of $N_2$ carrier gas was fed down each of these slots to ensure separation between the chemical mixture flowing down Slot 4 and those flowing down Slots 2 and 6.

Slot 4—This slot was again utilized to convey a precursor mixture of dimethyl zinc (DMZ), acetyl acetonate and trimethyl gallium (TMG). A standard bubbler at 36° C. was again used to create gaseous DMZ and transported through the bubbler by He so that 0.077 mol/min of DMZ was evaporated. A second standard bubbler at 60° C. was again used to create gaseous acetyl acetonate which was transported through the bubbler by $N_2$. A third standard bubbler at a temperature of 10° C. was again used to create gaseous TMG and transported through the bubbler by He so that 0.005 mol/min of TMG was evaporated. The three chemicals were premixed in a pipe and additional $N_2$ added to a total gas flow through Slot 4 of 13.5 slm.

Under these conditions, glass sheets were moved under the coater at a line speed of 3.0 m/min, where an electrically conductive zinc oxide coating having thickness of 570 nm and exhibiting a resistivity of $8.5\times10$-4 ohm cm was deposited at a deposition rate of 141 nm/sec. The coated glass article exhibited a Tvis of about 62% and a haze of about 7.7%.

In addition to acetyl acetonate, other additive compounds believed to be suitable in connection with the invention include trifluoro acetyl acetonate and hexafluoro acetyl acetonate.

In accordance with the provisions of the patent statutes, the present invention has been described in what is considered to represent its preferred embodiments. However, it should be noted that the invention can be practiced otherwise than as specifically illustrated and described without departing from its spirit or scope.

What is claimed is:

1. An apparatus for depositing a thin film on a moving heated substrate comprising:
    a main coater body having a predetermined length, width and height designated as x, y, and z, respectively, and an upper surface z1 and a lower surface z2;
    a plurality of inlet openings formed in the upper surface z1, wherein each of the inlet openings allows a flow of a gaseous reactant or an inert gas there through and is in fluid communication with a source of the gaseous reactant or the inert gas;
    a plurality of outlet openings formed in or recessed from the lower surface z2 to allow the flows to exit there through in multiple predetermined flow streams, wherein each of the outlet openings of the plurality of outlet openings is arranged to be in a parallel, spaced apart relationship with the other outlet openings along the width y of the main coater body;
    a plurality of flow pathways defined within the main coater body, wherein a first flow pathway of the plurality of flow pathways is at least partially defined by a first sidewall of the main coater body and a first gas flow separator and a second flow pathway of the plurality of flow pathways is at least partially defined by a second sidewall of the main coater body and the first gas flow separator or another gas flow separator, the first flow pathway being defined between a first inlet opening of the plurality of inlet openings and a first outlet opening of the plurality of outlet openings and the second flow pathway being defined between a second inlet opening of the plurality of inlet openings and a second outlet opening of the plurality of outlet openings, the first flow pathway and the second flow pathway being arranged to be in a spaced apart relationship with each other along the width y of the main coater body;

a first flow conditioner disposed in the first flow pathway, positioned between the first sidewall and the first gas flow separator, and disposed nearer the outlet opening of the first flow pathway than the inlet opening, and a second flow conditioner disposed in the second flow pathway, positioned between the second sidewall and the first gas flow separator or the another gas flow separator, and disposed nearer the outlet opening of the second flow pathway than the inlet opening; and a plurality of baffle blocks and cover blocks within the main coater body, wherein a first baffle block of the plurality of baffle blocks and a first cover block of the plurality of cover blocks disposed in the first flow pathway and positioned between the first sidewall and the first gas flow separator, wherein the first cover block is disposed at an end of the first flow pathway and the first baffle block is disposed between the first cover block and the first flow conditioner, and a second baffle block of the plurality of baffle blocks and a second cover block of the plurality of cover blocks disposed in the second flow pathway and positioned between the first gas flow separator or the another gas flow separator, wherein the second cover block is disposed at an end of the second flow pathway and the second baffle block is disposed between the second cover block and the second flow conditioner;

wherein each of the plurality of flow pathways has an identical straight flow pathway portion formed by each of the gas flow separators, the cover blocks and the baffle blocks, and a narrowing flow pathway portion formed by each of the gas flow separators, the baffle blocks and flow conditioners.

2. The apparatus defined in claim 1, wherein at least one of a plurality of supply lines is connected to each of the plurality of inlet openings.

3. The apparatus defined in claim 1, wherein at least one outlet opening of the plurality of outlet openings is configured to allow a flow of inert gas to exit therethrough.

4. The apparatus defined in claim 1, wherein one or more thermal control devices is/are capable of maintaining at least the plurality of outlet openings within + or −50° F. (±10° C.) of a desired set point temperature.

5. The apparatus defined in claim 1, further comprising one or more gaseous reactant exhaust openings formed in the lower surface z2 of the main coater body and spaced apart from the multiple predetermined flow streams.

6. The apparatus defined in claim 1, wherein a portion of at least one of the multiple predetermined flow streams is defined by one or more discharge directors.

7. The apparatus defined in claim 1, wherein the flow conditioner comprises a structure having a honeycomb configuration.

8. The apparatus defined in claim 6, wherein the one or more discharge directors and a deposition surface of a substrate are separated by a distance of no greater than 5.5 mm.

9. The apparatus defined in claim 1, wherein the plurality of outlet openings are recessed in the main coater body up to about 5.5 mm from the lower surface z2.

10. The apparatus defined in claim 1, wherein a discharge director extends a predetermined distance beyond at least one outlet opening of the plurality of outlet openings.

11. The apparatus defined in claim 1, wherein the plurality of outlet openings are formed in the lower surface z2 of the main coater body.

12. The apparatus defined in claim 3, wherein the at least one outlet opening is larger in width than the outlet openings adjacent thereto.

13. The apparatus defined in claim 1, wherein each outlet opening is of a length and a width and the length is greater than the width.

14. The apparatus defined in claim 1, wherein each outlet opening is spaced apart from an adjacent outlet opening by a distance of 1 mm or less.

15. An apparatus for use in a coater in a float glass system for depositing a thin film on a moving heated glass substrate, the apparatus comprising:

a main coater body having a predetermined length, width and height designated as x, y, and z, respectively, and an upper surface z1 and a lower surface z2;

a plurality of inlet openings formed in the upper surface z1, wherein each of the inlet openings allows a flow of a gaseous reactant or an inert gas therethrough and is in fluid communication with a source of the gaseous reactant or the inert gas;

a plurality of outlet openings formed in or recessed from the lower surface z2 to allow the flows to exit therethrough in multiple predetermined flow streams, wherein each of the outlet openings of the plurality of outlet openings is arranged to be in a parallel, spaced apart relationship with the other outlet openings along the width y of the main coater body;

a plurality of flow pathways defined within the main coater body, wherein a first flow pathway of the plurality of flow pathways is at least partially defined by a first sidewall of the main coater body and a first gas flow separator and a second flow pathway of the plurality of flow pathways is at least partially defined by a second sidewall of the main coater body and the first gas flow separator or another gas flow separator, the first flow pathway being defined between a first inlet opening of the plurality of inlet openings and a first outlet opening of the plurality of outlet openings and the second flow pathway being defined between a second inlet opening of the plurality of inlet openings and a second outlet opening of the plurality of outlet openings, the first flow pathway and the second flow pathway being arranged to be in a spaced apart relationship with each other along the width y of the main coater body;

a first flow conditioner disposed in the first flow pathway and positioned between the first sidewall and the first gas flow separator closer to the outlet opening of the first flow pathway than the inlet opening, and a second flow conditioner disposed in the second flow pathway and positioned between the second sidewall and the first gas flow separator or the another gas flow separator closer to the outlet opening of the second flow pathway than the inlet opening; and a plurality of baffle blocks and cover blocks within the main coater body, wherein a first baffle block of the plurality of baffle blocks and a first cover block of the plurality of cover blocks disposed in the first flow pathway and positioned between the first sidewall and the first gas flow separator, wherein the first cover block is disposed at an end of the first flow pathway and the first baffle block is disposed between the first cover block and the first flow conditioner, and a second baffle block of the plurality of baffle blocks and a second cover block of the plurality of cover blocks disposed in the second flow pathway and positioned between the first gas flow separator or the another gas flow separator, wherein the second cover block is disposed at an end of the second flow pathway and the second baffle block is disposed between the second cover block and the second flow conditioner;

wherein each of the plurality of flow pathways has an identical straight flow pathway portion formed by each of the gas flow separators, the cover blocks and the baffle blocks, and a narrowing flow pathway portion formed by each of the gas flow separators, the baffle blocks and flow conditioners.

* * * * *